US012658864B2

(12) United States Patent
Hase

(10) Patent No.: US 12,658,864 B2
(45) Date of Patent: Jun. 16, 2026

(54) POWER AMPLIFIER

(71) Applicant: Murata Manufacturing Co., Ltd.,
Kyoto (JP)

(72) Inventor: Masatoshi Hase, Kyoto (JP)

(73) Assignee: Murata Manufacturing Co., Ltd.,
Kyoto (JP)

( * ) Notice: Subject to any disclaimer, the term of this
patent is extended or adjusted under 35
U.S.C. 154(b) by 436 days.

(21) Appl. No.: 18/507,482

(22) Filed: Nov. 13, 2023

(65) Prior Publication Data

US 2024/0162866 A1      May 16, 2024

(30) Foreign Application Priority Data

Nov. 15, 2022    (JP) ................................. 2022-182387

(51) Int. Cl.
*H03F 1/02*        (2006.01)
*H03F 3/189*        (2006.01)
*H03F 3/213*        (2006.01)
(52) U.S. Cl.
CPC ............. *H03F 3/213* (2013.01); *H03F 3/189*
(2013.01)

(58) Field of Classification Search
CPC ..................................... H03F 1/02; H03F 1/07
USPC .............................................. 330/124 R, 295
See application file for complete search history.

(56) References Cited

U.S. PATENT DOCUMENTS

2022/0190790 A1      6/2022   Caron et al.

*Primary Examiner* — Henry Choe
(74) *Attorney, Agent, or Firm* — McDonald Hopkins LLC

(57) ABSTRACT

There are included a first amplifier and a second amplifier
electrically connected to a stage subsequent to the first
amplifier, a third amplifier and a fourth amplifier electrically
connected to a stage subsequent to the third amplifier, a
phase shifter that makes a phase of a radio-frequency signal
passing through a first path different from a phase of a
radio-frequency signal passing through a second path, a first
bias circuit that supplies a bias to the first amplifier and the
third amplifier, a second bias circuit that supplies a bias to
the first amplifier and the second amplifier, and a third bias
circuit that supplies a bias to the third amplifier and the
fourth amplifier. The second amplifier includes a second
transistor, the fourth amplifier includes a fourth transistor,
the second bias circuit includes a sixth transistor, and the
third bias circuit includes a seventh transistor.

8 Claims, 12 Drawing Sheets

POWER AMPLIFIER

CROSS REFERENCE TO RELATED APPLICATION

This application claims priority from Japanese Patent Application No. 2022-182387 filed on Nov. 15, 2022. The content of this application is incorporated herein by reference in its entirety.

BACKGROUND ART

The present disclosure relates to a power amplifier.

U.S. Patent Application Publication No. 2022/0190790 discloses an amplifier. In the amplifier, a radio-frequency input signal is input to a plurality of amplifier paths, phases of radio-frequency signals are made different from each other by the respective amplifier paths, signals amplified through gain adjustments of the respective amplifier paths are vectorially combined, and thus the phase and gain of a radio-frequency output signal are adjusted.

BRIEF SUMMARY

In the amplifier disclosed in U.S. Patent Application Publication No. 2022/0190790, however, gain adjustments of the respective amplifier paths are made only by collector biases of first-stage amplifiers in the respective amplifier paths. For this reason, in the amplifier disclosed in U.S. Patent Application Publication No. 2022/0190790, the phase of a radio-frequency signal output from a first-stage amplifier is changed by a collector bias, and the phase and gain of the amplifier paths as a whole are therefore not stable.

The present disclosure has been made in view of the above and aims to stabilize a phase and a gain.

A power amplifier according to an aspect of the present disclosure includes an input terminal that receives input of a radio-frequency input signal, an output terminal that outputs a radio-frequency output signal, a first path and a second path that are each electrically connected between the input terminal and the output terminal and that are connected in parallel with each other, a first amplifier and a second amplifier electrically connected to a stage subsequent to the first amplifier that are included in the first path, a third amplifier and a fourth amplifier electrically connected to a stage subsequent to the third amplifier that are included in the second path, a phase shifter that makes a phase of a radio-frequency signal passing through the first path different from a phase of a radio-frequency signal passing through the second path, a first bias circuit that is electrically connected to the first amplifier and the third amplifier and that supplies a bias to the first amplifier and the third amplifier, a second bias circuit that is electrically connected to the first amplifier and the second amplifier and that supplies a bias to the first amplifier and the second amplifier, and a third bias circuit that is electrically connected to the third amplifier and the fourth amplifier and that supplies a bias to the third amplifier and the fourth amplifier. The first amplifier includes a first transistor, the second amplifier includes a second transistor, the third amplifier includes a third transistor, the fourth amplifier includes a fourth transistor, the first bias circuit includes a fifth transistor, the second bias circuit includes a sixth transistor, and the third bias circuit includes a seventh transistor. The second transistor and the sixth transistor are connected so as to establish a current-mirror connection, and the fourth transistor and the seventh transistor are connected so as to establish a current-mirror connection.

The present disclosure enables a phase and a gain to be stabilized.

DETAILED DESCRIPTION

Embodiments of the present disclosure will be described in detail below with reference to the drawings. Note that these embodiments are not intended to limit the present disclosure. Each embodiment is illustrative, and it goes without necessarily saying that configurations described in different embodiments can be partially replaced or combined.

First Embodiment

Figure 1:
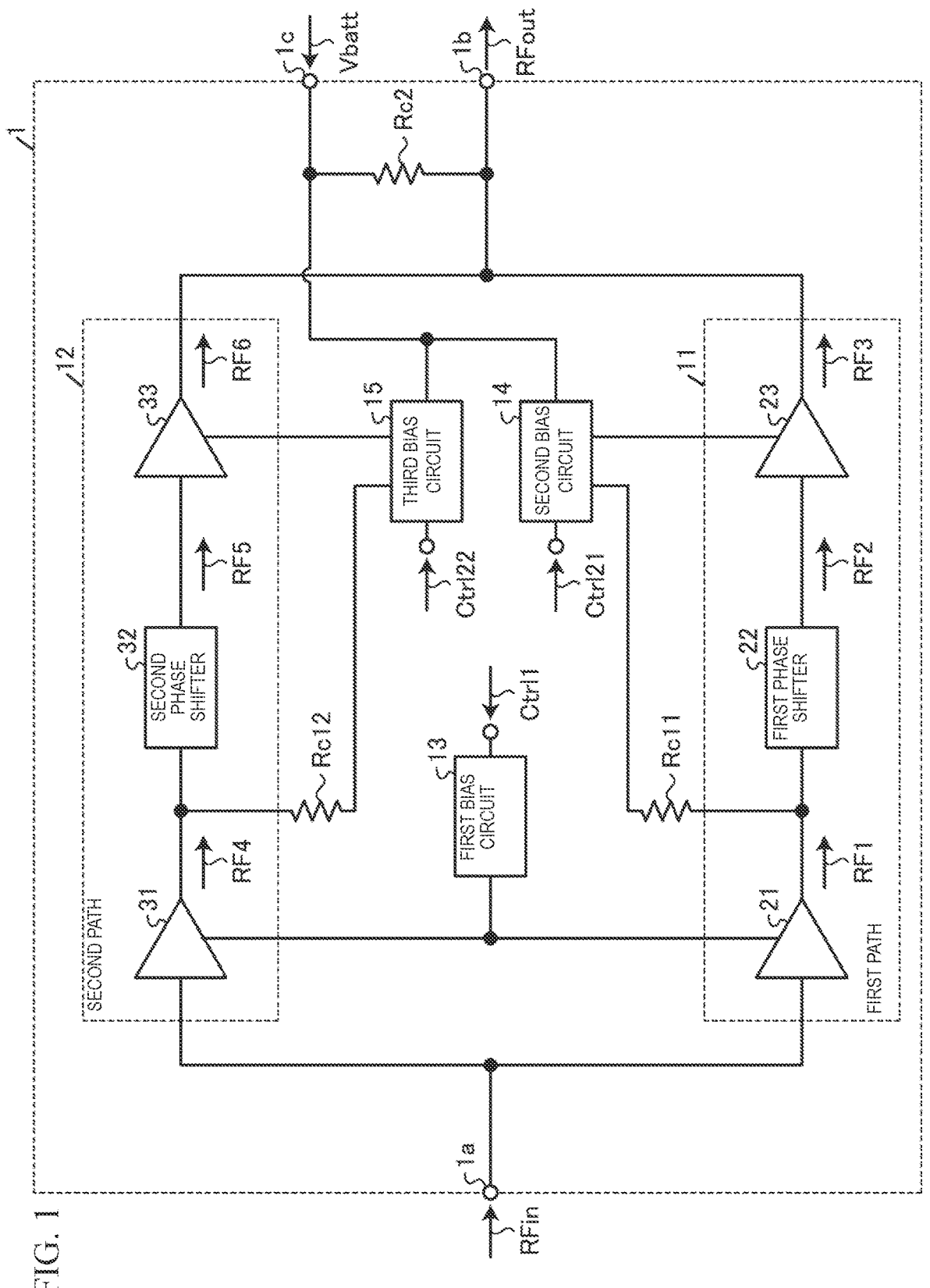
FIG. 1 is a diagram illustrating a configuration of a power amplifier according to a first embodiment.

FIG. 1 is a diagram illustrating a configuration of a power amplifier according to a first embodiment. A power amplifier 1 amplifies a radio-frequency input signal RFin input to an input terminal 1a and outputs a radio-frequency output signal RFout from an output terminal 1b. A power supply voltage Vbatt is input to a terminal 1c of the power amplifier 1.

The power amplifier 1 includes a first path 11, a second path 12, a first bias circuit 13, a second bias circuit 14, and a third bias circuit 15.

The first path 11 and the second path 12 are connected in parallel with each other. The first path 11 and the second path 12 are electrically connected between the input terminal 1a and the output terminal 1b.

The first path 11 includes a first amplifier 21, a first phase shifter 22, and a second amplifier 23.

The first amplifier 21 is electrically connected between the input terminal 1a and the first phase shifter 22. The first amplifier 21 amplifies a radio-frequency input signal RFin input to the input terminal 1a and outputs a radio-frequency signal RF1 that has been amplified to the first phase shifter 22.

The first phase shifter 22 is electrically connected between the first amplifier 21 and the second amplifier 23. The first phase shifter 22 shifts the radio-frequency signal RF1 by a first phase ψ and outputs, to the second amplifier 23, a radio-frequency signal RF2 that has been shifted. The first phase shifter 22 may have a function of providing impedance matching between the first amplifier 21 and the second amplifier 23.

The second amplifier 23 is electrically connected between the first phase shifter 22 and the output terminal 1b. The second amplifier 23 amplifies the radio-frequency signal RF2 and outputs a radio-frequency signal RF3 that has been amplified to the output terminal 1b.

The second path 12 includes a third amplifier 31, a second phase shifter 32, and a fourth amplifier 33.

The third amplifier 31 is electrically connected between the input terminal 1a and the second phase shifter 32. The third amplifier 31 amplifies the radio-frequency input signal RFin input to the input terminal 1a and outputs a radio-frequency signal RF4 that has been amplified to the second phase shifter 32.

The second phase shifter 32 is electrically connected between the third amplifier 31 and the fourth amplifier 33. The second phase shifter 32 shifts the radio-frequency signal RF4 by a second phase p different from the first phase ψ and outputs, to the fourth amplifier 33, a radio-frequency signal RF5 that has been shifted. The second phase shifter 32 may have a function of providing impedance matching between the third amplifier 31 and the fourth amplifier 33.

The fourth amplifier 33 is electrically connected between the second phase shifter 32 and the output terminal 1b. The fourth amplifier 33 amplifies the radio-frequency signal RF5 and outputs a radio-frequency signal RF6 that has been amplified to the output terminal 1b.

The radio-frequency signal RF3 and the radio-frequency signal RF6 are vectorially summed into a radio-frequency output signal RFout. The radio-frequency output signal RFout is output from the output terminal 1b. Incidentally, the power supply voltage Vbatt is supplied to the second amplifier 23 and the fourth amplifier 33 via a resistor Rc2.

In the first embodiment, a set of the first phase shifter 22 and the second phase shifter 32 corresponds to an example of "phase shifter" in the present disclosure.

The first bias circuit 13 is electrically connected to the first amplifier 21 and the third amplifier 31. The first bias circuit 13 supplies, in accordance with a control current Ctr11, a bias to the first amplifier 21 and the third amplifier 31.

The second bias circuit 14 is electrically connected to the first amplifier 21 via a resistor Rc11. Furthermore, the second bias circuit 14 is electrically connected to the second amplifier 23. The second bias circuit 14 supplies, in accordance with a control current Ctr121, a bias to the first amplifier 21 and the second amplifier 23.

The third bias circuit 15 is electrically connected to the third amplifier 31 via a resistor Rc12. Furthermore, the third bias circuit 15 is electrically connected to the fourth amplifier 33. The third bias circuit 15 supplies, in accordance with a control current Ctr122, a bias to the third amplifier 31 and the fourth amplifier 33.

Figure 2:
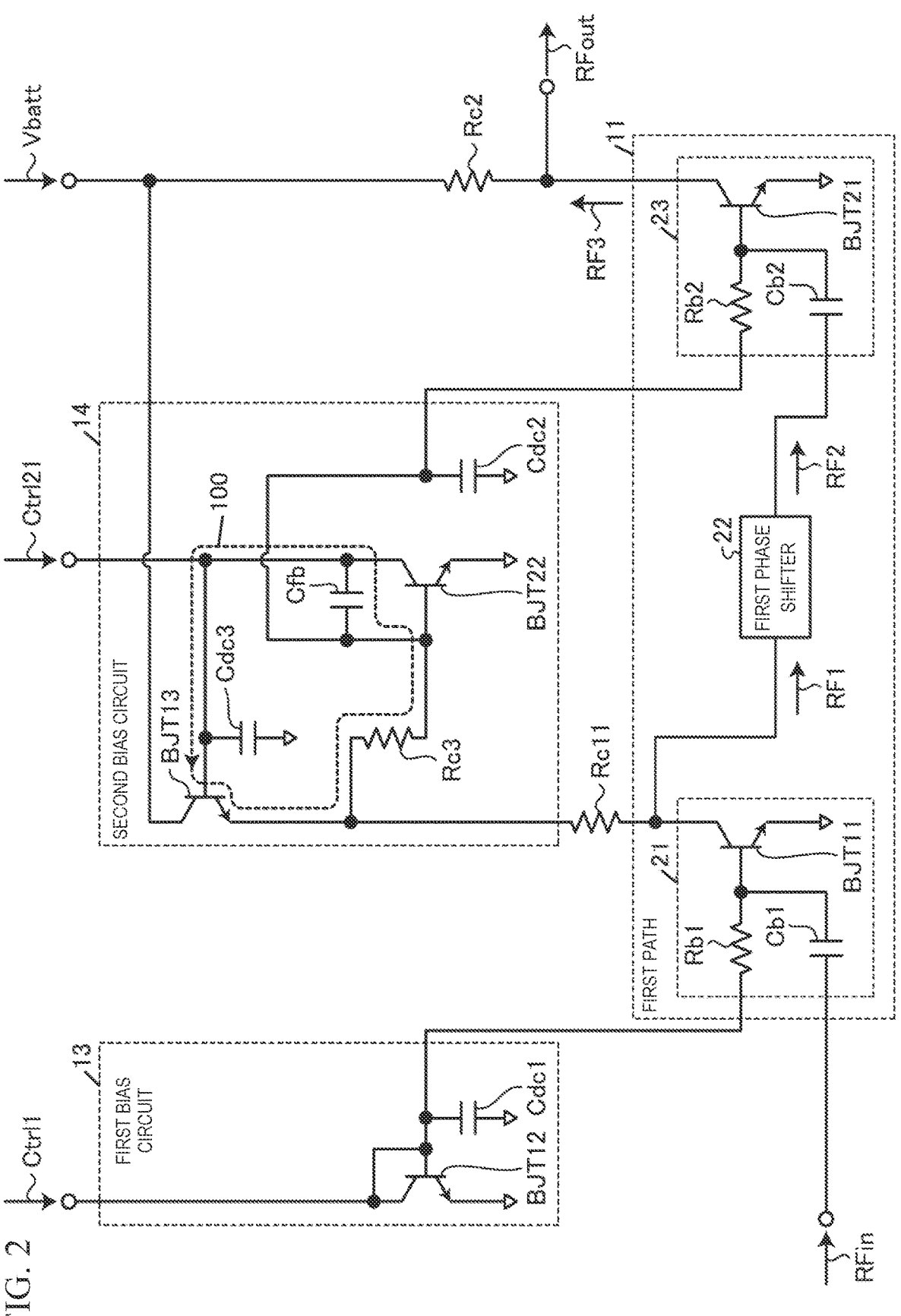
FIG. 2 is a diagram illustrating configurations of a first amplifier, a second amplifier, a first bias circuit, and a second bias circuit in the power amplifier according to the first embodiment.

FIG. 2 is a diagram illustrating configurations of the first amplifier, the second amplifier, the first bias circuit, and the second bias circuit in the power amplifier according to the first embodiment.

Note that configurations of the third amplifier 31, the fourth amplifier 33, and the third bias circuit 15 are similar to those of the first amplifier 21, the second amplifier 23, and the second bias circuit 14, and thus illustration and description thereof are omitted.

The first amplifier 21 includes a transistor BJT11, a resistor Rb1, and a capacitor Cb1.

The transistor BJT11 corresponds to an example of "first transistor" in the present disclosure. A transistor BJT11 of the third amplifier 31, which is not illustrated, (configuration similar to that of the first amplifier 21 in FIG. 2) corresponds to an example of "third transistor" in the present disclosure.

In the present disclosure, although each transistor is a bipolar transistor, the present disclosure is not limited to this. Although, as an example of the bipolar transistor, a hetero-junction bipolar transistor (HBT) is given, the present disclosure is not limited to this. The transistor may be, for example, a field effect transistor (FET). The transistor may be a multi-finger transistor including a plurality of unit transistors electrically connected in parallel. A unit transistor refers to a minimum component constituting the transistor.

The radio-frequency input signal RFin is input to one end of the capacitor Cb1. The capacitor Cb1 is a direct current (DC) cut capacitor that cuts a direct-current component of the radio-frequency input signal RFin. The other end of the capacitor Cb1 is electrically connected to a base of the transistor BJT11.

An emitter of the transistor BJT11 is electrically connected to a reference potential. Although, as an example of the reference potential, a ground potential is given, the present disclosure is not limited to this. A collector of the transistor BJT11 is electrically connected to one end of the resistor Rc11. The base of the transistor BJT11 is electrically connected to one end of the resistor Rb1.

The first bias circuit 13 includes a transistor BJT12 and a capacitor Cdc1.

The transistor BJT12 corresponds to an example of "fifth transistor" in the present disclosure.

An emitter of the transistor BJT12 is electrically connected to the reference potential. A collector and a base of the transistor BJT12 are electrically connected. That is, the transistor BJT12 is diode-connected. The control current Ctr11 is input to the collector and base of the transistor BJT12. The transistor BJT12 generates a voltage corresponding to the control current Ctr11.

One end of the capacitor Cdc1 is electrically connected to the collector and base of the transistor BJT12. The other end of the capacitor Cdc1 is electrically connected to the reference potential. The capacitor Cdc1 alternating current (AC)-grounds the collector and base of the transistor BJT12. Thus, the output impedance of the transistor BJT12 (impedances at the collector and the base) is reduced, and output of the transistor BJT12 is improved.

The collector and base of the transistor BJT12, and the one end of the capacitor Cdc1 are electrically connected to the other end of the resistor Rb1. That is, the transistor BJT12 and the transistor BJT11 are connected via the resistor Rb1 so as to establish a current-mirror connection. Thus, a collector current corresponding to the control current Ctr11 flows through the transistor BJT11.

Incidentally, the collector and base of the transistor BJT12, and the one end of the capacitor Cdc1 are also electrically connected to the other end of a resistor Rb1 of the third amplifier 31, which is not illustrated, (configuration similar to that of the first amplifier 21 in FIG. 2).

When the transistor BJT12 and the transistor BJT11 are connected so as to establish a current-mirror connection, the following effects can be obtained.

The transistor BJT11, which is a bipolar transistor, can change in temperature due to self-heating, and thus characteristics (for example, a voltage threshold at the base) can change. Hence, assuming that a fixed voltage is input to the base of the transistor BJT11, characteristics of the transistor BJT11 change even if a base voltage is fixed, and a collector current of the transistor BJT11 therefore changes.

In the first embodiment, on the other hand, if the transistor BJT11 and the transistor BJT12 generate heat themselves, they can be expected to reach almost the same temperature. That is, even if the transistor BJT11 and the transistor BJT12 generate heat themselves, they can be expected to exhibit almost the same characteristics.

The control current Ctr11 flows from the collector and base of the transistor BJT12 to the emitter, and a voltage corresponding to the control current Ctr11 is generated at the collector and base of the transistor BJT12. Collector and base voltages of the transistor BJT12 change in response to a change in temperature (a change in characteristics). The collector and base voltages of the transistor BJT12 are input to the base of the transistor BJT11. Hence, a current corresponding to the control current Ctr11 flows through the collector of the transistor BJT11 even if the temperature changes.

Thus, in the transistor BJT11, changes in gain are reduced, and the gain is stabilized.

The second amplifier 23 includes a transistor BJT21, a resistor Rb2, and a capacitor Cb2.

The transistor BJT21 corresponds to an example of "second transistor" in the present disclosure. A transistor BJT21 of the fourth amplifier 33, which is not illustrated, (configuration similar to that of the second amplifier 23 in FIG. 2) corresponds to an example of "fourth transistor" in the present disclosure.

The radio-frequency signal RF2 is input to one end of the capacitor Cb2. The capacitor Cb2 is a DC cut capacitor that cuts a direct-current component of the radio-frequency signal RF2. The other end of the capacitor Cb2 is electrically connected to a base of the transistor BJT21.

An emitter of the transistor BJT21 is electrically connected to the reference potential. A collector of the transistor BJT21 is electrically connected to one end of the resistor Rc2. The power supply voltage Vbatt is supplied to the other end of the resistor Rc2. The power supply voltage Vbatt is supplied to the collector of the transistor BJT21 via the resistor Rc2. The base of the transistor BJT21 is electrically connected to one end of the resistor Rb2.

The second bias circuit 14 includes a transistor BJT13, a transistor BJT22, a capacitor Cdc2, a capacitor Cdc3, a capacitor Cfb, and a resistor Rc3.

The transistor BJT22 corresponds to an example of "sixth transistor" in the present disclosure. The transistor BJT13 corresponds to an example of "eighth transistor" in the present disclosure. A transistor BJT22 of the third bias circuit 15, which is not illustrated, (configuration similar to that of the second bias circuit 14 in FIG. 2) corresponds to an example of "seventh transistor" in the present disclosure. A transistor BJT13 of the third bias circuit 15 corresponds to an example of "ninth transistor" in the present disclosure.

An emitter of the transistor BJT22 is electrically connected to the reference potential. A collector and the emitter of the transistor BJT22 are electrically connected via the capacitor Cfb. That is, the transistor BJT22 is diode-connected. The control current Ctr121 is input to the collector of the transistor BJT22. The collector and a base of the transistor BJT22 generate a voltage corresponding to the control current Ctr121.

One end of the capacitor Cdc2 is electrically connected to the base of the transistor BJT22. The other end of the capacitor Cdc2 is electrically connected to the reference potential. That is, the capacitor Cdc2 AC-grounds the collector and base of the transistor BJT22. Thus, the output impedance of the transistor BJT22 (impedances at the collector and the base) is reduced, and output of the transistor BJT22 is improved.

The base of the transistor BJT22 and the one end of the capacitor Cdc2 are electrically connected to the other end of the resistor Rb2. That is, the transistor BJT22 and the transistor BJT21 are connected via the resistor Rb2 so as to establish a current-mirror connection. Thus, a collector current corresponding to the control current Ctr121 flows through the transistor BJT21.

When the transistor BJT22 and the transistor BJT21 are connected so as to establish a current-mirror connection, the following effects can be obtained.

The transistor BJT21, which is a bipolar transistor, can change in temperature due to self-heating, and thus characteristics (for example, a voltage threshold at the base) can change. Hence, assuming that a fixed voltage is input to the base of the transistor BJT21, characteristics of the transistor BJT21 change even if a base voltage is fixed, and a collector current of the transistor BJT21 therefore changes.

In the first embodiment, on the other hand, if the transistor BJT21 and the transistor BJT22 generate heat themselves, they can be expected to reach almost the same temperature. That is, even if the transistor BJT21 and the transistor BJT22 generate heat themselves, they can be expected to exhibit almost the same characteristics.

The control current Ctr121 flows from the collector of the transistor BJT22 to the emitter, and a voltage corresponding to the control current Ctr121 is generated at the collector and base of the transistor BJT22. Collector and base voltages of the transistor BJT22 change in response to a change in temperature (a change in characteristics). The collector and base voltages of the transistor BJT22 are input to the base of the transistor BJT21. Hence, a current corresponding to the control current Ctr121 flows through the collector of the transistor BJT21 even if the temperature changes.

Thus, in the transistor BJT21, changes in gain are reduced, and the gain is stabilized.

The power supply voltage Vbatt is input to a collector of the transistor BJT13. A base of the transistor BJT13 is electrically connected to the collector of the transistor BJT22. A voltage equivalent to a voltage drop across the transistor BJT22 is input to the base of the transistor BJT13.

An emitter of the transistor BJT13 is electrically connected to the other end of the resistor Rc11. That is, the transistor BJT13 and the resistor Rc11 are connected so as to establish an emitter-follower connection. The transistor BJT13 outputs a bias corresponding to the control current Ctr121 to the collector of the transistor BJT11.

One end of the capacitor Cdc3 is electrically connected to the base of the transistor BJT13. The other end of the capacitor Cdc3 is electrically connected to the reference potential. That is, the capacitor Cdc3 AC-grounds the base of the transistor BJT13. Thus, the output impedance of the transistor BJT13 (an impedance at the emitter) is reduced, and output of the transistor BJT13 is improved.

One end of the resistor Rc3 is electrically connected to the emitter of the transistor BJT13. That is, the transistor BJT13 and the resistor Rc3 are connected so as to establish an emitter-follower connection. The other end of the resistor Rc3 is electrically connected to the base of the transistor BJT22.

Thus, a feedback loop 100 is formed that extends from the base of the transistor BJT13, to the emitter of the transistor BJT13, to the resistor Rc3, to the capacitor Cfb, and then back to the base of the transistor BJT13.

Negative feedback is applied to the transistor BJT13 by the feedback loop 100. Hence, when the transistor BJT13 changes in temperature due to self-heating and changes in characteristics (for example, a voltage threshold at the base), a base bias changes so that a change in characteristics is cancelled out. Consequently, even if the transistor BJT13 changes in temperature due to self-heating and changes in characteristics, a bias given to the collector of the transistor BJT11 can be kept constant.

Thus, in the transistor BJT11, changes in gain are reduced, and the gain is stabilized.

Incidentally, the capacitor Cfb limits a band of the feedback loop 100. Thus, the capacitor Cfb can keep noise from being amplified in the feedback loop 100. Furthermore, the capacitor Cfb can keep a radio-frequency signal from oscillating in the feedback loop 100.

Circuit Simulation Results

Figure 3:
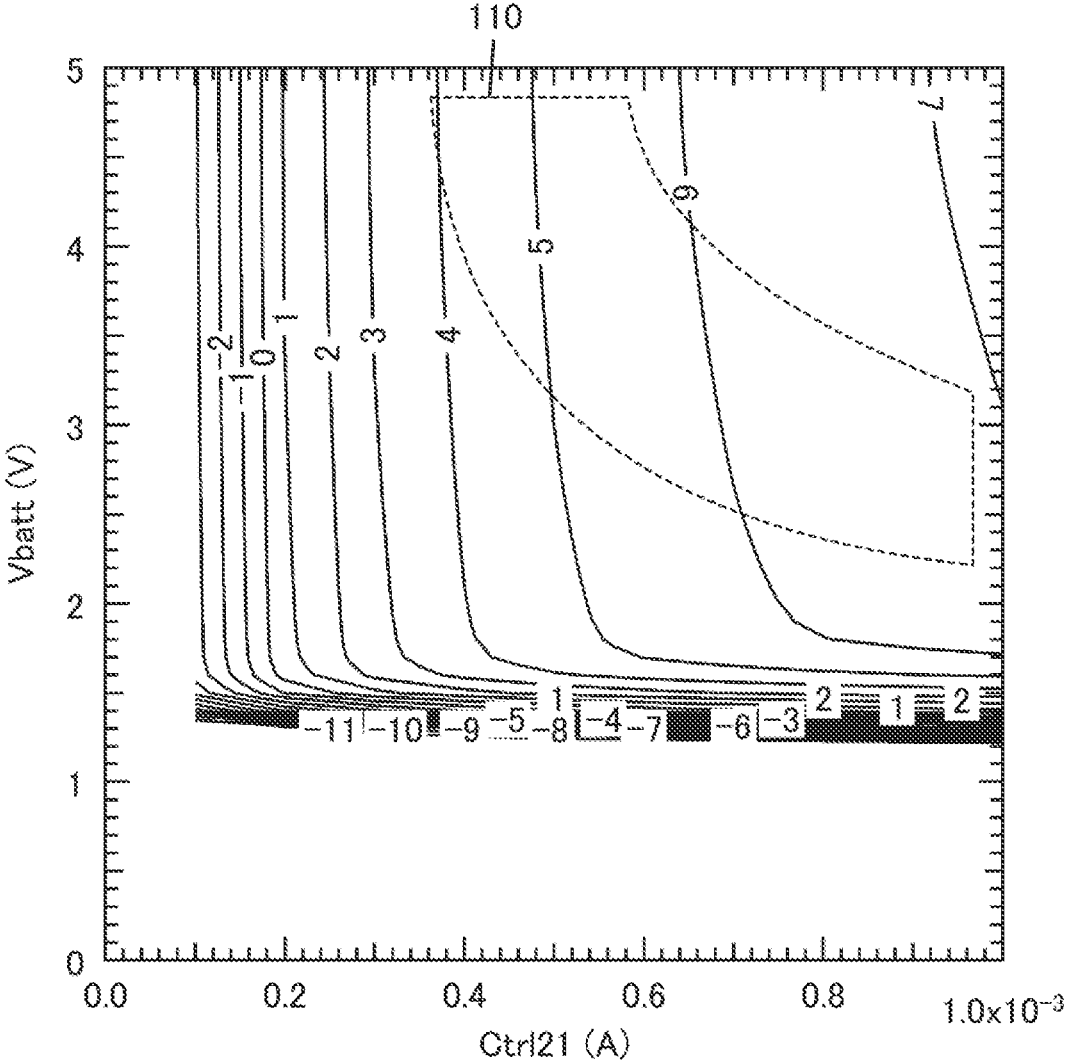
FIG. 3 is a graph illustrating circuit simulation results of the power amplifier according to the first embodiment.
Figure 4:
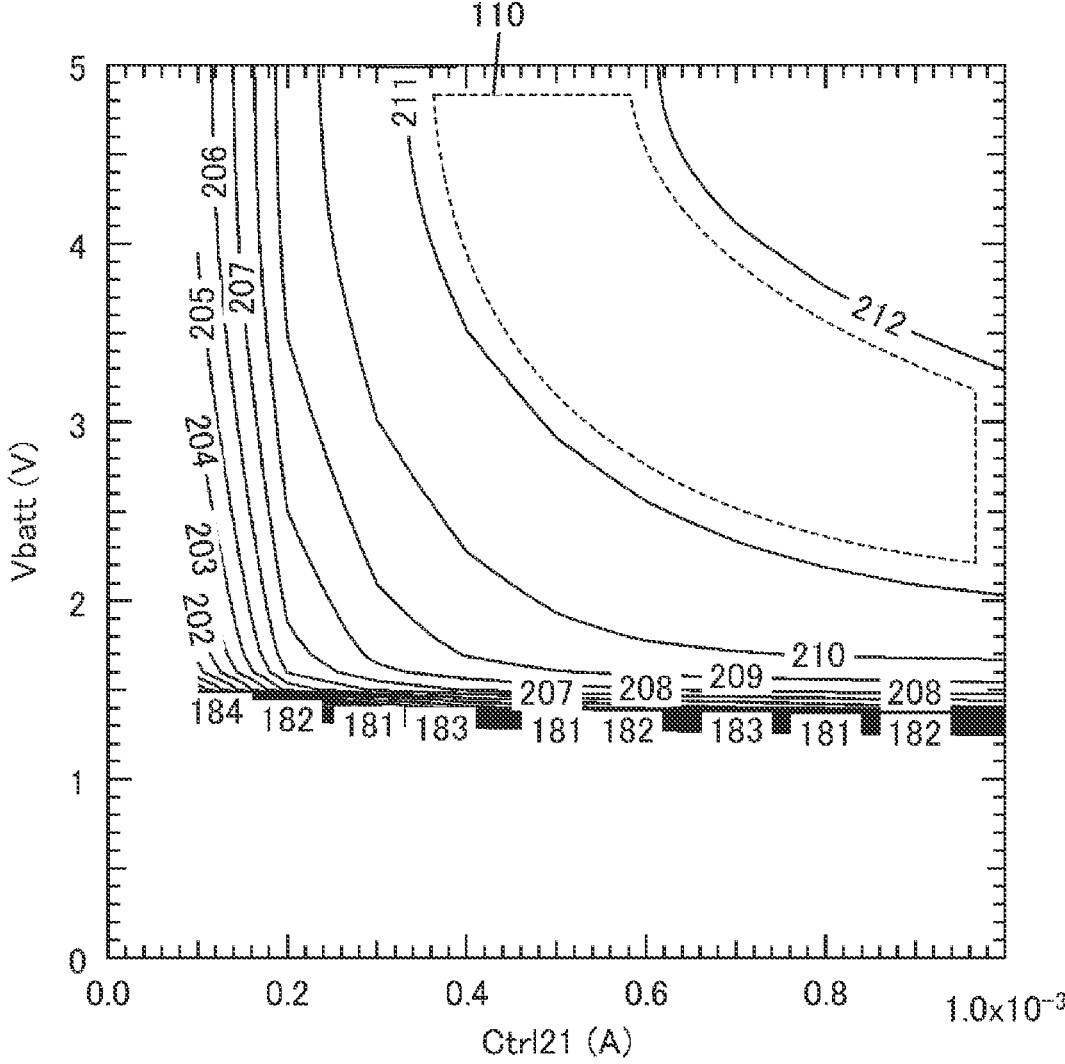
FIG. 4 is a graph illustrating circuit simulation results of the power amplifier according to the first embodiment.

FIGS. 3 and 4 are graphs illustrating circuit simulation results of the power amplifier according to the first embodiment.

FIG. 3 is a graph illustrating gains (dB) of the first path 11 exhibited when the control current Ctr121 and the power supply voltage Vbatt are changed. In FIG. 3, the horizontal axis represents the control current Ctr121, and the vertical axis represents the power supply voltage Vbatt. Numerical values on lines in FIG. 3 represent gains (dB) of the first path 11.

FIG. 4 is a graph illustrating phases (deg) of the radio-frequency signal RF3 exhibited when the control current Ctr121 and the power supply voltage Vbatt are changed. In FIG. 4, the horizontal axis represents the control current Ctr121, and the vertical axis represents the power supply voltage Vbatt. Numerical values on lines in FIG. 4 represent phases (deg) of the radio-frequency signal RF3.

For example, assuming that the first path 11 is caused to operate in a region 110 in FIGS. 3 and 4, only the gain can be changed (see FIG. 3) with the phase being little changed (see FIG. 4).

Thus, the first path 11 can operate as a phase-invariant variable gain amplifier.

Effects

The second bias circuit 14 can control, in accordance with one control current Ctr121, a collector bias of the transistor BJT11 and a base bias of the transistor BJT21. Furthermore, the second bias circuit 14 can cancel out changes in characteristics of the transistor BJT11 and the transistor BJT21 due to changes in temperature. Note that the same holds true for the third bias circuit 15 as well as the second bias circuit 14.

Thus, the power amplifier 1 can reduce variations in gain and stabilize the gain.

When the transistor BJT22 and the transistor BJT21 are connected so as to establish a current-mirror connection, even if the transistor BJT21 generates heat itself, the second bias circuit 14 can give a bias corresponding to the control current Ctr121 to the base of the transistor BJT21.

Thus, the power amplifier 1 can reduce variations in gain and stabilize the gain.

When the transistor BJT12 and the transistor BJT11 are connected so as to establish a current-mirror connection, even if the transistor BJT11 generates heat itself, the first bias circuit 13 can give a bias corresponding to the control current Ctr11 to the base of the transistor BJT11.

Thus, the power amplifier 1 can reduce variations in gain and stabilize the gain.

When the feedback loop 100 is formed, even if the transistor BJT13 generates heat itself, the second bias circuit 14 can keep a bias given to the collector of the transistor BJT11 constant.

Thus, the power amplifier 1 can reduce variations in gain and stabilize the gain.

Second Embodiment

Of components in a second embodiment, components that are the same as components in the first embodiment are denoted by the same reference signs, and a description thereof is omitted.

Figure 5:
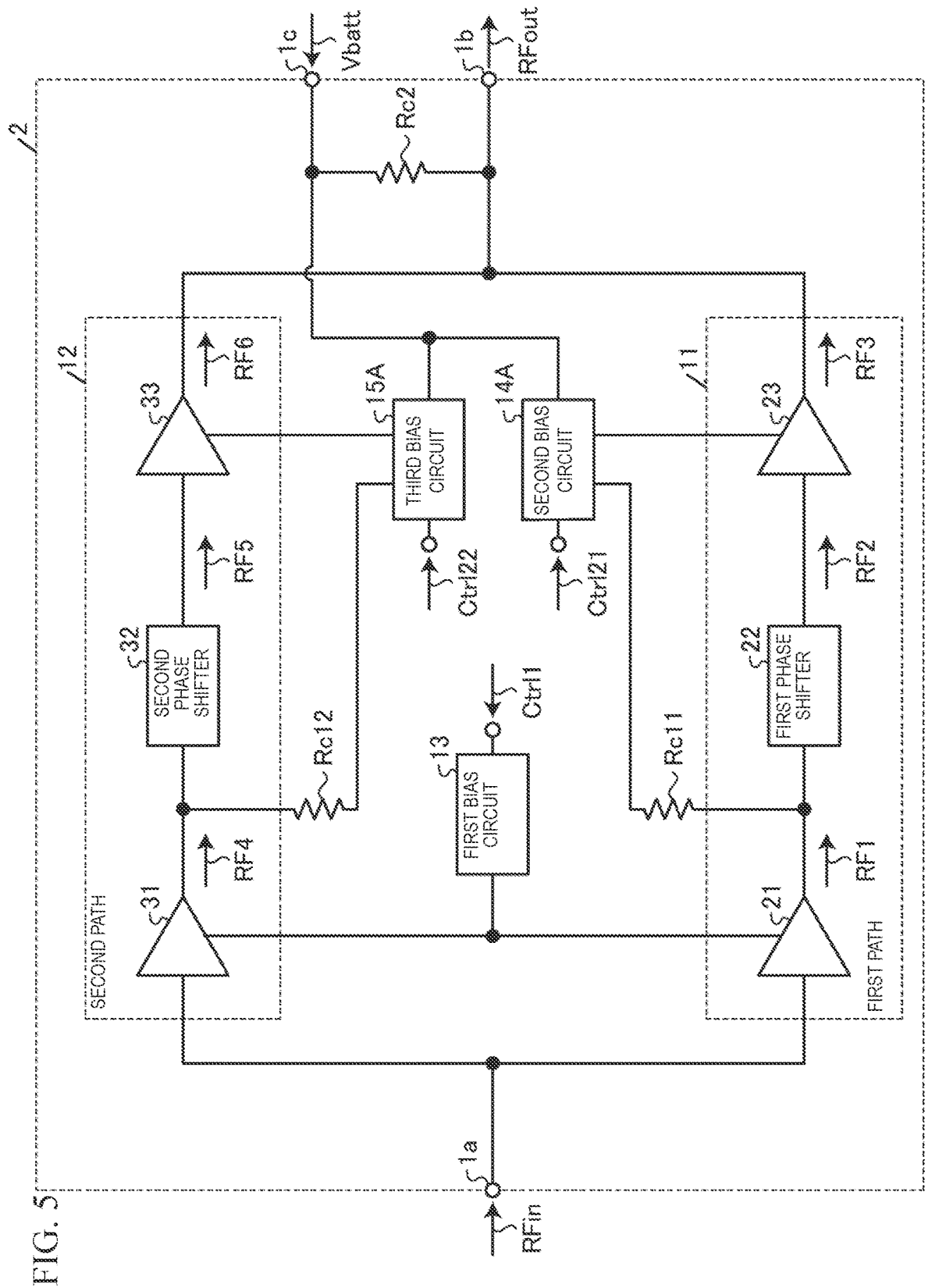
FIG. 5 is a diagram illustrating a configuration of a power amplifier according to a second embodiment.

FIG. 5 is a diagram illustrating a configuration of a power amplifier according to the second embodiment.

In comparison with the power amplifier 1 (see FIG. 1) according to the first embodiment, a power amplifier 2 according to the second embodiment includes a second bias circuit 14A and a third bias circuit 15A in place of the second bias circuit 14 and the third bias circuit 15.

Figure 6:
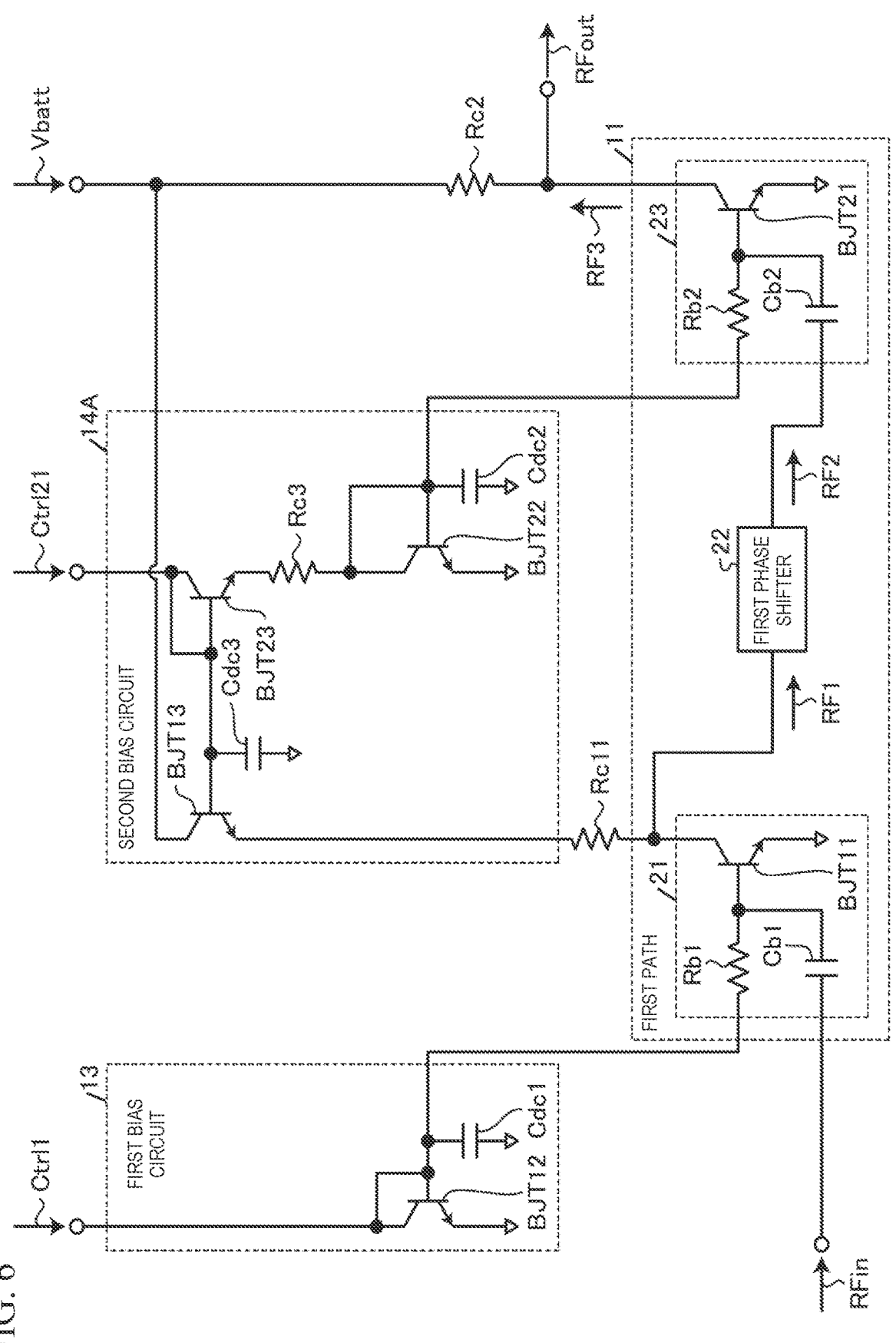
FIG. 6 is a diagram illustrating configurations of the first amplifier, the second amplifier, the first bias circuit, and a second bias circuit in the power amplifier according to the second embodiment.

FIG. 6 is a diagram illustrating configurations of the first amplifier, the second amplifier, the first bias circuit, and the second bias circuit in the power amplifier according to the second embodiment.

Note that a configuration of the third bias circuit 15A is similar to that of the second bias circuit 14A, and thus illustration and description thereof are omitted.

In comparison with the second bias circuit 14 (see FIG. 2), the second bias circuit 14A further includes a transistor BJT23. Furthermore, in comparison with the second bias circuit 14, the second bias circuit 14A does not include the capacitor Cfb.

A collector and a base of the transistor BJT23 are electrically connected. That is, the transistor BJT23 is diode-connected. The control current Ctr121 is input to the collector and base of the transistor BJT23. The base of the transistor BJT23 is electrically connected to the base of the transistor BJT13. That is, the transistor BJT23 and the transistor BJT13 are connected so as to establish a current-mirror connection.

The one end of the resistor Rc3 is electrically connected to an emitter of the transistor BJT23.

The collector and base of the transistor BJT22 are electrically connected to the other end of the resistor Rc3.

At the collector and base of the transistor BJT23, a voltage equal to the sum of a voltage drop across the transistor BJT23, a voltage drop across the resistor Rc3, and a voltage drop across the transistor BJT22 is generated. This voltage is input to the base of the transistor BJT13.

In the second bias circuit 14A, no feedback loop 100 (see FIG. 2) in the second bias circuit 14 is formed. Hence, the capacitor Cfb (see FIG. 2) that limits the band of the feedback loop 100 is optional.

Effects

In the second bias circuit 14A, since no feedback loop 100 in the second bias circuit 14 is formed, if there is noise, noise is not amplified in the feedback loop 100, and a radio-frequency signal does not oscillate.

Thus, the power amplifier 2 can reduce noise while maintaining the effect (reduction of variations in gain) of the power amplifier 1.

Third Embodiment

Of components in a third embodiment, components that are the same as components in other embodiments are denoted by the same reference signs, and a description thereof is omitted.

Figure 7:
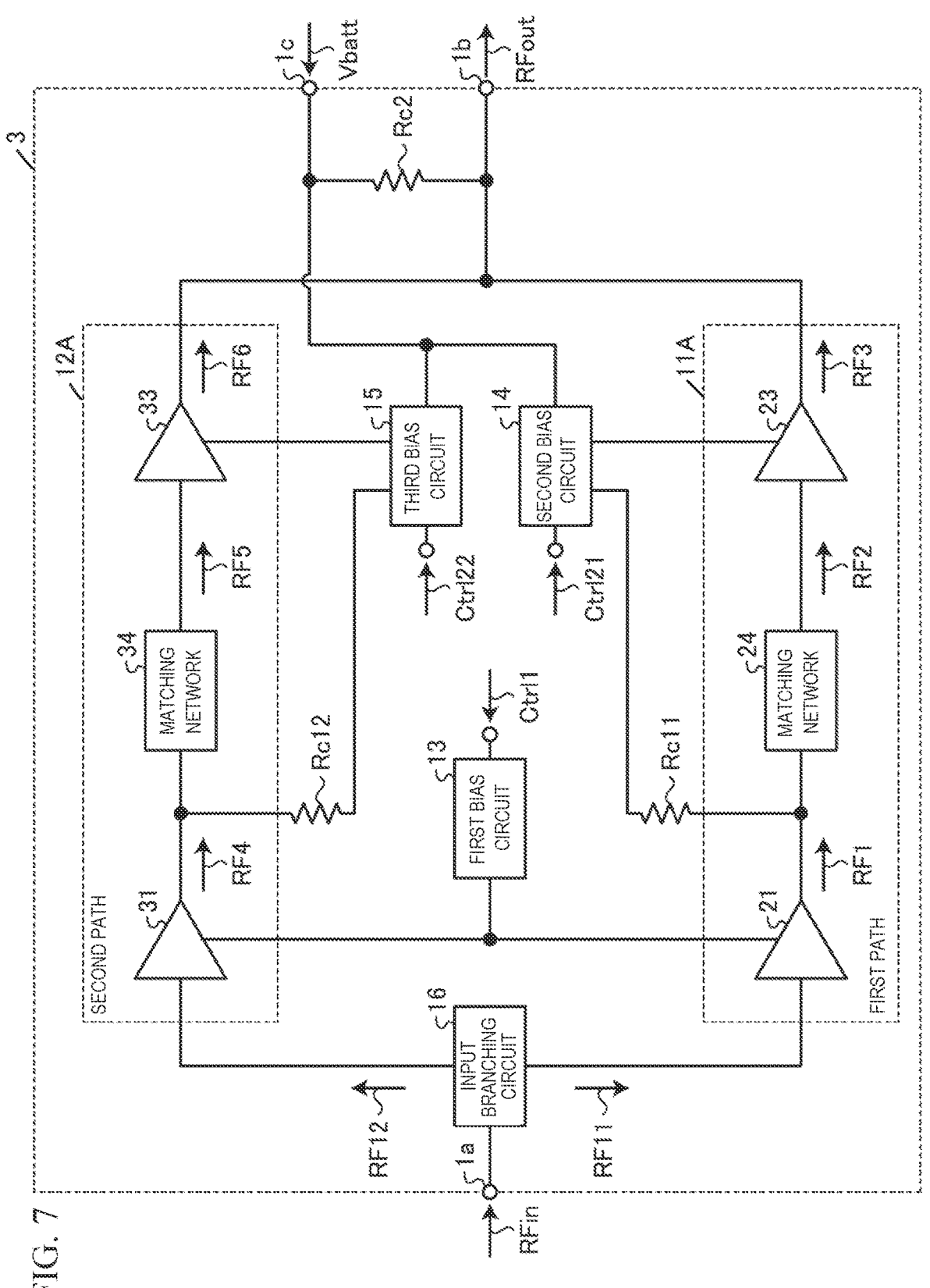
FIG. 7 is a diagram illustrating a configuration of a power amplifier according to a third embodiment.

FIG. 7 is a diagram illustrating a configuration of a power amplifier according to the third embodiment.

In comparison with the power amplifier 1 (see FIG. 1) according to the first embodiment, a power amplifier 3 according to the third embodiment includes a first path 11A and a second path 12A in place of the first path 11 and the second path 12. Furthermore, in comparison with the power amplifier 1, the power amplifier 2 further includes an input branching circuit 16.

In the third embodiment, the input branching circuit 16 corresponds to an example of "phase shifter" in the present disclosure.

The input branching circuit 16 is electrically connected between the input terminal 1a and the first amplifier 21 and is also electrically connected between the input terminal 1a and the third amplifier 31.

The input branching circuit 16 has a function of providing impedance matching between the input terminal 1a and the first amplifier 21. Additionally, the input branching circuit 16 has a function of providing impedance matching between the input terminal 1a and the third amplifier 31. Furthermore, the input branching circuit 16 has a function of providing isolation between the first amplifier 21 and the third amplifier 31. Although, as an example of the input branching circuit 16, a 90°-hybrid coupler is given, the present disclosure is not limited to this.

The input branching circuit 16 delays the radio-frequency input signal RFin by a first phase ψ and outputs, to the first amplifier 21, a radio-frequency signal RF11 that has been delayed. Furthermore, the input branching circuit 16 delays the radio-frequency input signal RFin by a second phase φ different from the first phase ψ and outputs, to the third amplifier 31, a radio-frequency signal RF12 that has been delayed.

In comparison with the first path 11 (see FIG. 1), the first path 11A includes a matching network 24 in place of the first phase shifter 22. The matching network 24 provides impedance matching between the first amplifier 21 and the second amplifier 23.

In comparison with the second path 12 (see FIG. 1), the second path 12A includes a matching network 34 in place of the second phase shifter 32. The matching network 34 provides impedance matching between the third amplifier 31 and the fourth amplifier 33.

The matching network 24 and the matching network 34 may have the same circuit configuration. That is, the matching network 24 and the matching network 34 may be the same in the amount of phase delay.

Figure 8:
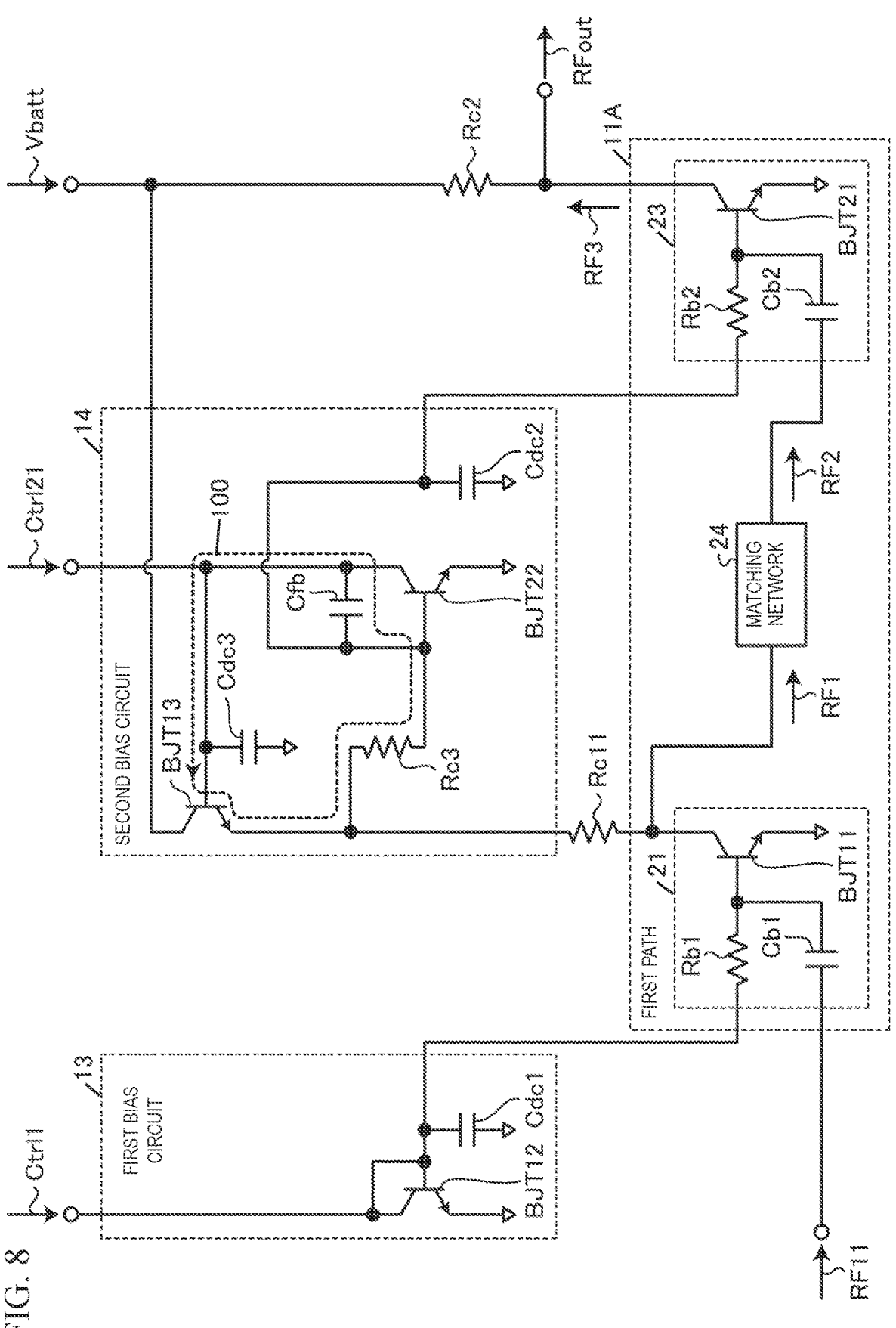
FIG. 8 is a diagram illustrating configurations of the first amplifier, the second amplifier, the first bias circuit, and the second bias circuit in the power amplifier according to the third embodiment.

FIG. 8 is a diagram illustrating configurations of the first amplifier, the second amplifier, the first bias circuit, and the second bias circuit in the power amplifier according to the third embodiment.

Note that a configuration of the second path 12A is similar to that of the first path 11A, and thus illustration and description thereof are omitted.

The matching network 24 is electrically connected between the first amplifier 21 and the second amplifier 23 and provides impedance matching between the first amplifier 21 and the second amplifier 23.

Effects

The power amplifier 3 can reduce variations in gain and stabilize the gain as in the power amplifier 1 according to the first embodiment.

The input branching circuit 16 can provide isolation between the first amplifier 21 and the third amplifier 31. Hence, a loop passing through the first path 11A and the second path 12A is not formed.

Thus, in the power amplifier 3, noise and a radio-frequency signal do not circulate through the first path 11A and the second path 12A, and oscillation can therefore be reduced.

As for the first amplifier 21 and the third amplifier 31, respective input impedances can change due to a change in bias. However, isolation between the first amplifier 21 and the third amplifier 31 is provided. Hence, even if one of the input impedances of the first amplifier 21 and the third amplifier 31 changes, the other input impedance is not affected.

Thus, the power amplifier 3 can reduce variations in voltage standing wave ratio (VSWR) exhibited when the phase of a radio-frequency signal is varied.

Fourth Embodiment

Of components in a fourth embodiment, components that are the same as components in other embodiments are denoted by the same reference signs, and a description thereof is omitted.

Figure 9:
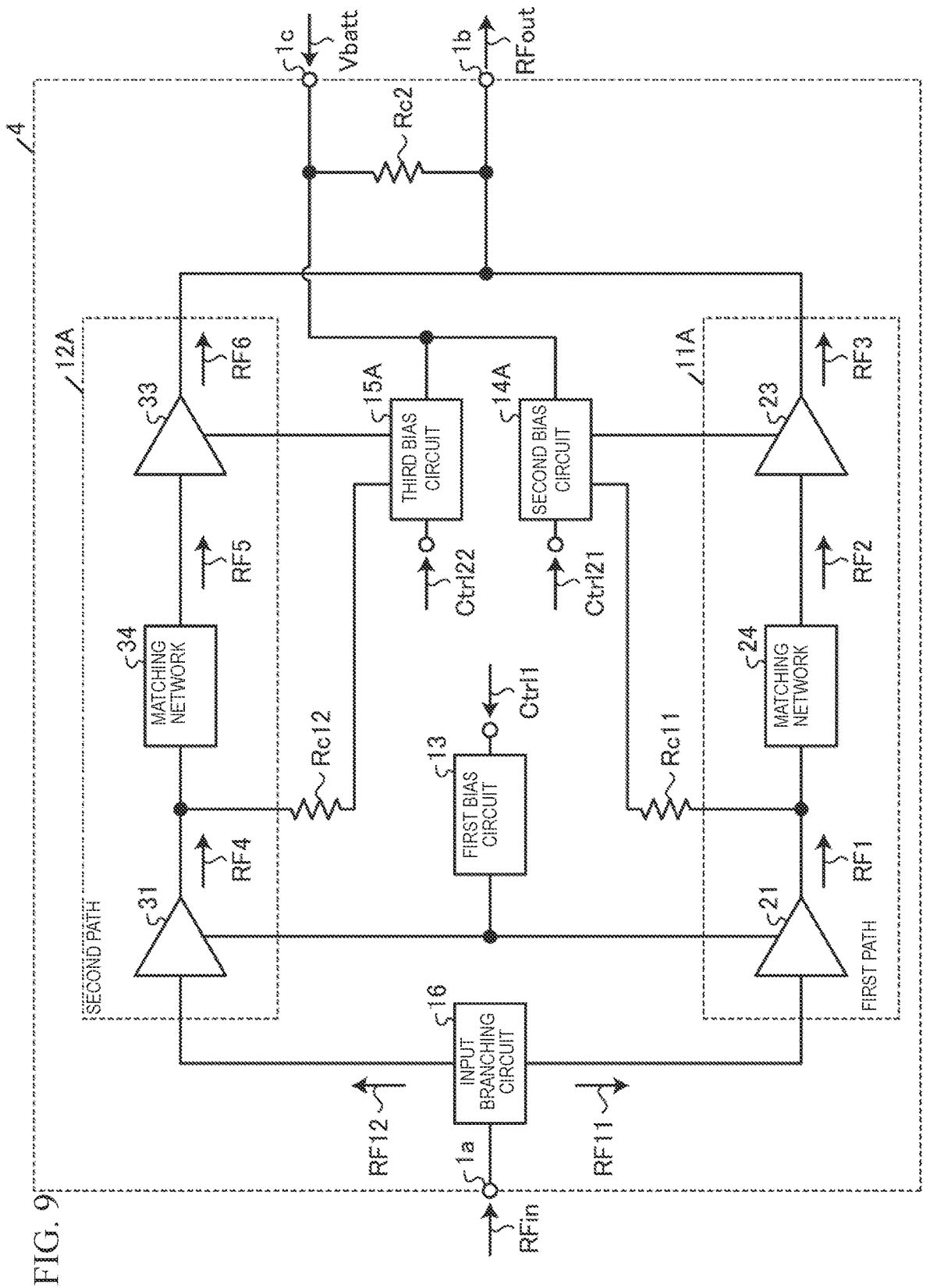
FIG. 9 is a diagram illustrating a configuration of a power amplifier according to a fourth embodiment.

FIG. 9 is a diagram illustrating a configuration of a power amplifier according to the fourth embodiment.

In comparison with the power amplifier 3 (see FIG. 7) according to the third embodiment, a power amplifier 4 according to the fourth embodiment includes the second bias circuit 14A and the third bias circuit 15A in place of the second bias circuit 14 and the third bias circuit 15.

Figure 10:
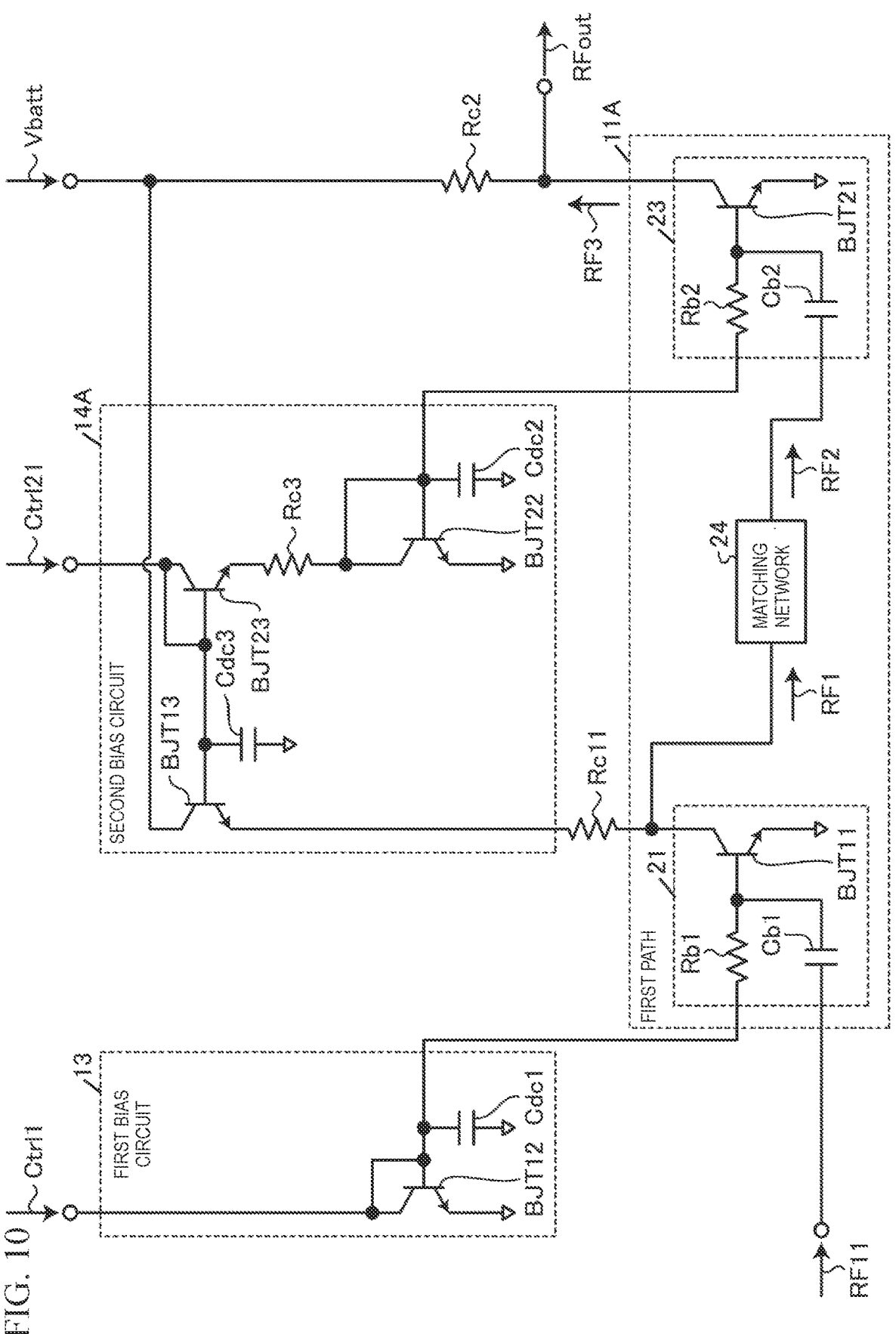
FIG. 10 is a diagram illustrating configurations of the first amplifier, the second amplifier, the first bias circuit, and the second bias circuit in the power amplifier according to the fourth embodiment.

FIG. 10 is a diagram illustrating configurations of the first amplifier, the second amplifier, the first bias circuit, and the second bias circuit in the power amplifier according to the fourth embodiment.

Effects

The power amplifier 4 can reduce variations in gain and stabilize the gain as in the power amplifier 1 according to the first embodiment.

In the power amplifier 4, no feedback loop 100 (see FIG. 2) is formed as in the power amplifier 2 according to the second embodiment, and thus noise can be reduced.

In the power amplifier 4, noise and a radio-frequency signal do not circulate through the first path 11A and the second path 12A as in the power amplifier 3 according to the third embodiment, and oscillation can therefore be reduced.

In the power amplifier 4, as in the power amplifier 3 according to the third embodiment, even if one of input impedances of the first amplifier 21 and the third amplifier 31 changes, the other input impedance is not affected, and variations in VSWR exhibited when the phase of a radio-frequency signal is varied can therefore be reduced.

Fifth Embodiment

Of components in a fifth embodiment, components that are the same as components in other embodiments are denoted by the same reference signs, and a description thereof is omitted.

Figure 11:
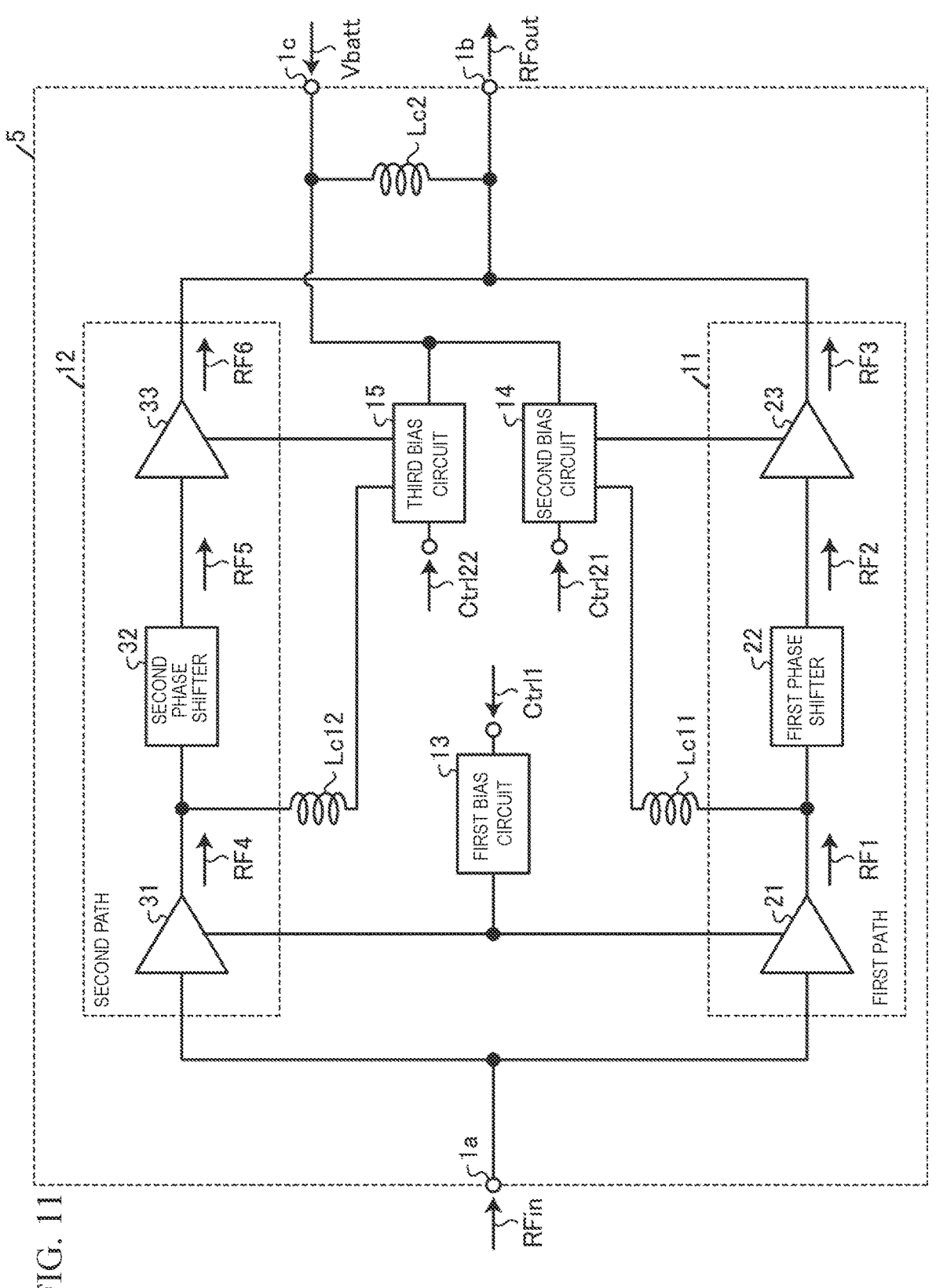
FIG. 11 is a diagram illustrating a configuration of a power amplifier according to a fifth embodiment.

FIG. 11 is a diagram illustrating a configuration of a power amplifier according to the fifth embodiment.

In comparison with the power amplifier 1 (see FIG. 1) according to the first embodiment, a power amplifier 5 according to the fifth embodiment includes an inductor Lc11, an inductor Lc12, and an inductor Lc2 in place of the resistor Rc11, the resistor Rc12, and the resistor Rc2.

The inductor Lc11 is electrically connected between the second bias circuit 14 and the first amplifier 21. The inductor Lc12 is electrically connected between the third bias circuit 15 and the third amplifier 31. The inductor Lc2 is electrically connected between the terminal 1c and the second amplifier 23 and between the terminal 1c and the fourth amplifier 33.

Effects

Voltage drops across the inductor Lc11, the inductor Lc12, and the inductor Lc2 are smaller than those across the resistor Rc11, the resistor Rc12, and the resistor Rc2.

Thus, the power amplifier 5 can achieve higher output power than the power amplifier 1.

Sixth Embodiment

Of components in a sixth embodiment, components that are the same as components in other embodiments are denoted by the same reference signs, and a description thereof is omitted.

Figure 12:
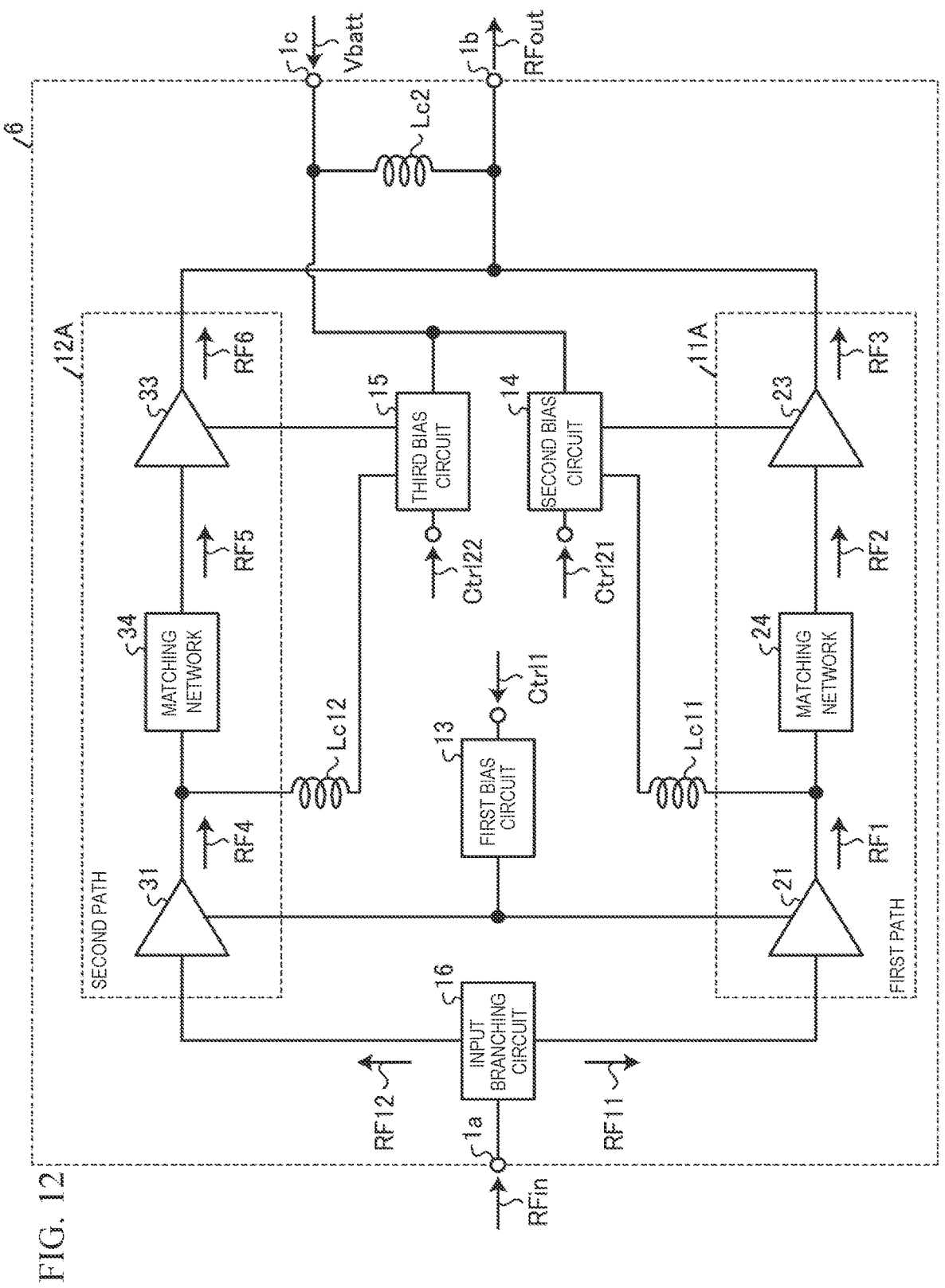
FIG. 12 is a diagram illustrating a configuration of a power amplifier according to a sixth embodiment.

FIG. 12 is a diagram illustrating a configuration of a power amplifier according to the sixth embodiment.

In comparison with the power amplifier 5 (see FIG. 11) according to the fifth embodiment, a power amplifier 6 according to the sixth embodiment includes the first path 11A and the second path 12A in place of the first path 11 and the second path 12. Furthermore, in comparison with the power amplifier 5, the power amplifier 6 further includes the input branching circuit 16.

Effects

The power amplifier 6 can achieve higher output power than the power amplifier 1 as in the power amplifier 5.

Configuration Examples of Present Disclosure

The present disclosure can also take the following configurations.

(1)

A power amplifier including:

an input terminal configured to receive input of a radio-frequency input signal;

an output terminal configured to output a radio-frequency output signal;

a first path and a second path that are each electrically connected between the input terminal and the output terminal and that are connected in parallel with each other;

a first amplifier and a second amplifier electrically connected to a stage subsequent to the first amplifier that are included in the first path;

a third amplifier and a fourth amplifier electrically connected to a stage subsequent to the third amplifier that are included in the second path;

a phase shifter configured to make a phase of a radio-frequency signal passing through the first path different from a phase of a radio-frequency signal passing through the second path;

a first bias circuit electrically connected to the first amplifier and the third amplifier and configured to supply a bias to the first amplifier and the third amplifier;

a second bias circuit electrically connected to the first amplifier and the second amplifier and configured to supply a bias to the first amplifier and the second amplifier; and a third bias circuit electrically connected to the third amplifier and the fourth amplifier and configured to supply a bias to the third amplifier and the fourth amplifier, wherein the first amplifier includes a first transistor, wherein the second amplifier includes a second transistor, wherein the third amplifier includes a third transistor, wherein the fourth amplifier includes a fourth transistor, wherein the first bias circuit includes a fifth transistor, wherein the second bias circuit includes a sixth transistor, wherein the third bias circuit includes a seventh transistor, wherein the second transistor and the sixth transistor are connected so as to establish a current-mirror connection, and wherein the fourth transistor and the seventh transistor are connected so as to establish a current-mirror connection.

(2)

The power amplifier according to the above-described (1), wherein the phase shifter includes a first phase shifter electrically connected between the first amplifier and the second amplifier and configured to shift a radio-frequency signal output by the first amplifier by a first phase, and a second phase shifter electrically connected between the third amplifier and the fourth amplifier and configured to shift a radio-frequency signal output by the second amplifier by a second phase different from the first phase.

(3)

The power amplifier according to the above-described (1), wherein the phase shifter includes an input branching circuit electrically connected between the input terminal and the first amplifier and the third amplifier, configured to shift the radio-frequency input signal by a first phase and output a shifted signal to the first amplifier, and configured to shift the radio-frequency input signal by a second phase different from the first phase and output a shifted signal to the third amplifier.

(4)

The power amplifier according to any one of the above-described (1) to (3), wherein the second bias circuit includes an eighth transistor configured to supply a bias to the first amplifier, and wherein the third bias circuit includes a ninth transistor configured to supply a bias to the third amplifier.

(5)

The power amplifier according to the above-described (4),
wherein the sixth transistor and the eighth transistor constitute a feedback loop, and
wherein the seventh transistor and the ninth transistor constitute a feedback loop.

(6)

The power amplifier according to the above-described (4),
wherein the sixth transistor and the eighth transistor do not constitute a feedback loop, and
wherein the seventh transistor and the ninth transistor do not constitute a feedback loop.

(7)

The power amplifier according to any one of the above-described (1) to (6),
wherein the fifth transistor
is connected to the first transistor so as to establish a current-mirror connection, and
wherein the fifth transistor
is connected to the third transistor so as to establish a current-mirror connection.

(8)

The power amplifier according to any one of the above-described (1) to (7),
wherein the second bias circuit
supplies a bias to the first amplifier via a first inductor,
wherein the third bias circuit
supplies a bias to the third amplifier via a second inductor, and
wherein the second amplifier and the fourth amplifier receive supply of a power supply voltage via a third inductor.

The above-described embodiments are intended to facilitate understanding of the present disclosure but are not intended for a limited interpretation of the present disclosure. The present disclosure can be changed or improved without necessarily departing from the gist thereof and also encompasses equivalents thereof.

What is claimed is:

1. A power amplifier comprising:
an input terminal configured to receive input of a radio-frequency input signal;
an output terminal configured to output a radio-frequency output signal;
a first path and a second path that are each electrically connected between the input terminal and the output terminal, and that are connected in parallel with each other;
a first amplifier in the first path;
a second amplifier in the first path and electrically connected to a stage subsequent to the first amplifier;
a third amplifier in the second path;
a fourth amplifier in the second path and electrically connected to a stage subsequent to the third amplifier;
a phase shifter configured to make a phase of a radio-frequency signal passing through the first path different from a phase of a radio-frequency signal passing through the second path;
a first bias circuit electrically connected to the first amplifier and to the third amplifier, and configured to supply a first bias to the first amplifier and to the third amplifier;
a second bias circuit electrically connected to the first amplifier and to the second amplifier, and configured to supply a second bias to the first amplifier and to the second amplifier; and a third bias circuit electrically connected to the third amplifier and to the fourth amplifier, and configured to supply a third bias to the third amplifier and to the fourth amplifier,
wherein the first amplifier comprises a first transistor,
wherein the second amplifier comprises a second transistor,
wherein the third amplifier comprises a third transistor,
wherein the fourth amplifier comprises a fourth transistor,
wherein the first bias circuit comprises a fifth transistor,
wherein the second bias circuit comprises a sixth transistor,
wherein the third bias circuit comprises a seventh transistor,
wherein the second transistor and the sixth transistor are connected in a current-mirror connection, and
wherein the fourth transistor and the seventh transistor are connected in a current-mirror connection.

2. The power amplifier according to claim 1, wherein the phase shifter comprises:
a first phase shifter electrically connected between the first amplifier and the second amplifier, and configured to shift a radio-frequency signal output by the first amplifier by a first phase, and
a second phase shifter electrically connected between the third amplifier and the fourth amplifier and configured to shift a radio-frequency signal output by the second amplifier by a second phase different from the first phase.

3. The power amplifier according to claim 1, wherein the phase shifter comprises:
an input branching circuit electrically connected between the input terminal and the first and third amplifiers, configured to shift the radio-frequency input signal by a first phase and to output a shifted signal to the first amplifier, and configured to shift the radio-frequency input signal by a second phase different from the first phase and to output a shifted signal to the third amplifier.

4. The power amplifier according to claim 1,
wherein the second bias circuit comprises an eighth transistor configured to supply a fourth bias to the first amplifier, and
wherein the third bias circuit comprises a ninth transistor configured to supply a fifth bias to the third amplifier.

5. The power amplifier according to claim 4,
wherein the sixth transistor and the eighth transistor constitute a first feedback loop, and
wherein the seventh transistor and the ninth transistor constitute a second feedback loop.

6. The power amplifier according to claim 4,
wherein the sixth transistor and the eighth transistor do not constitute a first feedback loop, and
wherein the seventh transistor and the ninth transistor do not constitute a second feedback loop.

7. The power amplifier according to claim 1,
wherein the fifth transistor is connected to the first transistor in a current-mirror connection, and
wherein the fifth transistor is connected to the third transistor so in a current mirror connection.

8. The power amplifier according to claim 1, wherein the second bias circuit is configured to supply the second bias to the first amplifier via a first inductor, wherein the third bias circuit is configured to supply the third bias to the third amplifier via a second inductor, and wherein the second amplifier and the fourth amplifier are configured to receive supply of a power supply voltage via a third inductor.

\* \* \* \* \*